(12) United States Patent
Yamaguchi

(10) Patent No.: US 10,923,561 B2
(45) Date of Patent: Feb. 16, 2021

(54) SEMICONDUCTOR DEVICE

(71) Applicant: DENSO CORPORATION, Kariya (JP)

(72) Inventor: Motoo Yamaguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 45 days.

(21) Appl. No.: 16/135,323

(22) Filed: Sep. 19, 2018

(65) Prior Publication Data
US 2019/0088736 A1 Mar. 21, 2019

(30) Foreign Application Priority Data

Sep. 20, 2017 (JP) .............................. JP2017-179848

(51) Int. Cl.
*H01L 29/06* (2006.01)
*H01L 29/40* (2006.01)
(Continued)

(52) U.S. Cl.
CPC .. *H01L 29/0615* (2013.01); *H01L 21/823481* (2013.01); *H01L 27/0629* (2013.01); *H01L 27/088* (2013.01); *H01L 29/0638* (2013.01); *H01L 29/404* (2013.01); *H01L 29/405* (2013.01); *H01L 29/7395* (2013.01); *H01L 21/823493* (2013.01); *H01L 29/16* (2013.01); *H01L 29/78* (2013.01); *H01L 29/861* (2013.01); *H01L 29/866* (2013.01)

(58) Field of Classification Search
CPC . H01L 29/0615; H01L 29/866; H01L 29/404; H01L 29/7395; H01L 29/7811; H01L 29/716; H01L 29/78; H01L 29/16; H01L 29/405; H01L 27/088; H01L 27/0629
See application file for complete search history.

(56) References Cited

U.S. PATENT DOCUMENTS

2002/0175425 A1 11/2002 Nishikawa et al.
2003/0107102 A1 6/2003 Ozeki et al.
(Continued)

FOREIGN PATENT DOCUMENTS

JP 2-2664129 10/1997
JP 2003-188381 7/2003
(Continued)

*Primary Examiner* — Hoa B Trinh
(74) *Attorney, Agent, or Firm* — Nixon & Vanderhye P.C.

(57) ABSTRACT

A semiconductor device includes a semiconductor substrate having a major surface and both an element-forming region and an outer peripheral voltage-withstanding region that are provided on the major surface side of the semiconductor substrate. The element-forming region includes both a cell region for forming a power element and a circuit element region for forming at least one circuit element. The circuit element region is interposed between the outer peripheral voltage-withstanding region and the cell region. The outer peripheral voltage-withstanding region includes a boundary region that adjoins the element-forming region. In the boundary region, there is provided one or more voltage-withstanding regions. At least one of the one or more voltage-withstanding regions has a withstand voltage lower than both the withstand voltages of the cell region and the circuit element region.

11 Claims, 10 Drawing Sheets

(51) Int. Cl.
  *H01L 29/739*    (2006.01)
  *H01L 27/06*     (2006.01)
  *H01L 27/088*    (2006.01)
  *H01L 21/8234*   (2006.01)
  H01L 29/866      (2006.01)
  H01L 29/16       (2006.01)
  H01L 29/78       (2006.01)
  H01L 29/861      (2006.01)

(56) References Cited

U.S. PATENT DOCUMENTS

| | | |
|---|---|---|
| 2007/0215898 A1 | 9/2007 | Ozeki et al. |
| 2007/0246738 A1 | 10/2007 | Otake |
| 2007/0272942 A1 | 11/2007 | Otake |
| 2011/0006338 A1* | 1/2011 | Senoo .............. H01L 29/0696 |
| | | 257/139 |
| 2011/0133246 A1 | 6/2011 | Ueno |
| 2013/0153955 A1 | 6/2013 | Naito |
| 2014/0015005 A1 | 1/2014 | Ishii |
| 2015/0102452 A1 | 4/2015 | Kamibaba et al. |
| 2015/0171198 A1* | 6/2015 | Song .............. H01L 29/0615 |
| | | 257/139 |

FOREIGN PATENT DOCUMENTS

| | | |
|---|---|---|
| JP | 2-3664129 | 6/2005 |
| JP | 2-3707428 | 10/2005 |
| JP | 2006-013093 | 1/2006 |
| JP | 2010-010556 | 1/2010 |
| JP | 2012-009645 | 1/2012 |
| JP | 2014-103159 | 6/2014 |

* cited by examiner

SEMICONDUCTOR DEVICE

CROSS-REFERENCE TO RELATED APPLICATION

This application is based on and claims priority from Japanese Patent Application No. 2017-179848 filed on Sep. 20, 2017, the contents of which are hereby incorporated by reference in its entirety into this application.

BACKGROUND

1 Technical Field

The present invention relates to semiconductor devices that include an element-forming region and a voltage-withstanding region.

2 Description of Related Art

There are known semiconductor devices which employ power elements (or power electronic elements) such as an IGBT (Insulated Gate Bipolar Transistor) and in which a voltage-withstanding region is provided on the outer peripheral side of a power-element cell region for the purpose of improving the surge resistance.

For example, Japanese Patent No. JP3664129B2 discloses a semiconductor device that has both a first semiconductor region that is of p-type and a voltage-withstanding region provided in a surface region of an $n^-$-type semiconductor layer. The first semiconductor region is a region for forming a semiconductor element. The voltage-withstanding region includes a second semiconductor region that is of $p^+$-type; the second semiconductor region is formed on the outer peripheral side of and spaced from the first semiconductor region. In the voltage-withstanding region, there is formed a p-n junction between the $n^-$-type semiconductor layer and the $p^+$-type second semiconductor region. The impurity gradient at this p-n junction is greater than that at a p-n junction between the $n^-$-type semiconductor layer and the p-type first semiconductor region. Consequently, when a surge is applied, the p-n junction formed in the voltage-withstanding region is broken down first, thereby preventing breakdown of power-element cells.

It should be noted that the term "surface region" used hereinafter denotes a region including a surface and its vicinity inside the surface.

On the other hand, there is a growing demand for reducing the sizes and improving the performance of semiconductor devices in various applications such as automotive and industrial applications. For example, it has been investigated to form circuits, which control and/or protect power-element cells, on the same semiconductor substrate as the power-element cells. These circuits are constituted of a plurality of circuit blocks; each of the circuit blocks employs various types of circuit elements (e.g., a resistor and a transistor). Therefore, unlike a power-element cell region where power-element cells having the same structure are uniformly arranged, a circuit element region is an assembly of complicated and various element structures.

However, there are the following problems when the power-element cells and the circuit elements are arranged on the same semiconductor substrate. For example, a vertical power element is structured so that upon application of a voltage to a gate electrode provided on a major surface side of the semiconductor substrate, electric current flows between a low-potential electrode provided on the major surface side and a high-potential electrode provided on a back surface side of the semiconductor substrate. That is, the high-potential electrode is formed over the entire back surface of the semiconductor substrate and opposed to the circuit element region in the vertical direction; thus it is easy for the high-potential electrode to cause electrical interference to the circuit element region. Moreover, due to the above structural features of the elements, an unintentional parasitic structure may be formed between the circuit elements or the power-element cells may electrically interfere with the circuit elements at the boundaries between the power-element cells and the circuit elements.

Therefore, when, for example, a high-speed and high-voltage surge due to an electrostatic discharge is applied, a large amount of surge current may flow to the circuit elements because of the imbalance in impedance between the power-element cells and the circuit elements. Moreover, since various circuit elements, such as a resistance element, a MOSFET (Metal Oxide Semiconductor Field Effect Transistor), a capacitive element, a diode and a bipolar transistor, are arranged in the circuit element region, bias may occur in the surge current flowing in the circuit element region. Consequently, when the surge current is locally concentrated to exceed the surge current ratings of the power-element cells or the circuit elements, a latch-up phenomenon may occur, making it difficult to ensure the surge resistance of the semiconductor device.

SUMMARY

According to one exemplary embodiment, there is provided a first semiconductor device. The first semiconductor device includes a semiconductor substrate having a major surface, a first semiconductor region that is of a first conductive type and provided on the major surface of the semiconductor substrate, and an element-forming region and an outer peripheral voltage-withstanding region both of which are provided on the major surface side of the semiconductor substrate. The element-forming region includes both a cell region and a circuit element region. The cell region includes a second semiconductor region that is of a second conductive type and provided in a surface region of the first semiconductor region to form a power element. The circuit element region includes a third semiconductor region that is of the second conductive type and provided in the surface region of the first semiconductor region to form at least one circuit element. The circuit element region is interposed between the outer peripheral voltage-withstanding region and the cell region. The outer peripheral voltage-withstanding region includes a boundary region that adjoins the element-forming region. The boundary region includes a fourth semiconductor region that is of the second conductive type and provided in the surface region of the first semiconductor region. In the fourth semiconductor region, there is provided one or more voltage-withstanding regions. At least one of the one or more voltage-withstanding regions has a withstand voltage lower than both a withstand voltage of the cell region and a withstand voltage of the circuit element region.

With the above configuration, it becomes possible to provide both the cell region and the circuit element region on the same semiconductor substrate, thereby reducing the size of the first semiconductor device.

Moreover, with the above configuration, when a high-speed and high-voltage surge is applied to the first semiconductor device, the least one of the one or more voltage-withstanding regions having the lower withstand voltage is allowed to be broken down first in the first semiconductor device, thereby absorbing the surge on the outer peripheral side of the element-forming region. Consequently, it becomes possible to make the density of the breakdown current flowing into the cell region and the circuit element region lower than the allowable current densities of the cell region and the circuit element region. As a result, it becomes possible to prevent latch-up damage to the first semiconductor device.

Accordingly, the first semiconductor device is superior in surge resistance, compact in size and high in reliability.

According to another exemplary embodiment, there is provided a second semiconductor device. The second semiconductor device includes a semiconductor substrate having a major surface, a first semiconductor region that is of a first conductive type and provided on the major surface of the semiconductor substrate, and an element-forming region and an outer peripheral voltage-withstanding region both of which are provided on the major surface side of the semiconductor substrate. The element-forming region includes both a cell region and a circuit element region. The cell region includes a second semiconductor region that is of a second conductive type and provided in a surface region of the first semiconductor region to form a power element. The circuit element region includes a third semiconductor region that is of the second conductive type and provided in the surface region of the first semiconductor region to form at least one circuit element. The cell region is provided to surround the circuit element region. The outer peripheral voltage-withstanding region includes a boundary region that adjoins the element-forming region. The boundary region includes a fourth semiconductor region that is of the second conductive type and provided in the surface region of the first semiconductor region. In the fourth semiconductor region, there is provided one or more voltage-withstanding regions. At least one of the one or more voltage-withstanding regions has a withstand voltage lower than both a withstand voltage of the cell region and a withstand voltage of the circuit element region.

With the above configuration, it becomes possible to provide both the cell region and the circuit element region on the same semiconductor substrate, thereby reducing the size of the second semiconductor device.

Moreover, with the above configuration, on the outer peripheral side of the circuit element region where various circuit elements may be arranged, there is provided the cell region which generally has a uniform structure and thus in which surge current uniformly flows. Consequently, it becomes possible to suppress the surge current from being biased, thereby making it possible to uniformly and stably absorb surge on the outer peripheral side of the circuit element region. As a result, it becomes possible to suppress local concentration of electric current in the element-forming region, thereby improving the latch-up resistance of the second semiconductor device.

Furthermore, with the above configuration, when a high-speed and high-voltage surge is applied to the second semiconductor device, the least one of the one or more voltage-withstanding regions having the lower withstand voltage is allowed to be broken down first in the second semiconductor device, thereby absorbing the surge on the outer peripheral side of the element-forming region. Consequently, it becomes possible to make the density of the breakdown current flowing into the cell region and the circuit element region lower than the allowable current densities of the cell region and the circuit element region. As a result, it becomes possible to prevent latch-up damage to the second semiconductor device.

Accordingly, the second semiconductor device is superior in surge resistance, compact in size and high in reliability.

BRIEF DESCRIPTION OF THE DRAWINGS

The present invention will be understood more fully from the detailed description given hereinafter and from the accompanying drawings of exemplary embodiments, which, however, should not be taken to limit the present invention to the specific embodiments but are for the purpose of explanation and understanding only.

In the accompanying drawings.

DESCRIPTION OF EMBODIMENTS

Figure 1:
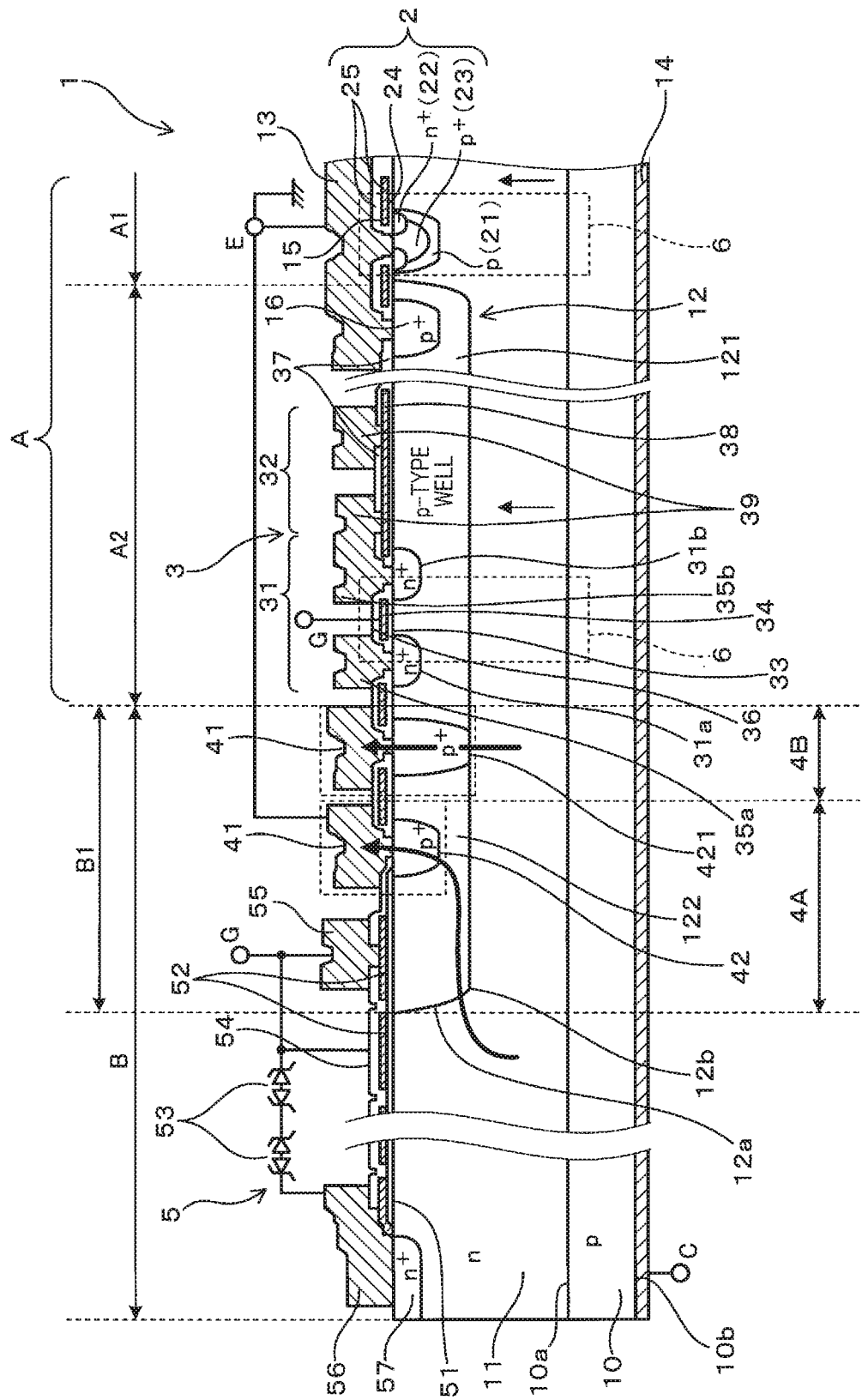
FIG. 1 is an enlarged cross-sectional view, taken along the line I-I in FIG. 2, of part of a semiconductor device according to a first embodiment.

Exemplary embodiments will be described hereinafter with reference to FIGS. 1-13. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

Figure 2:
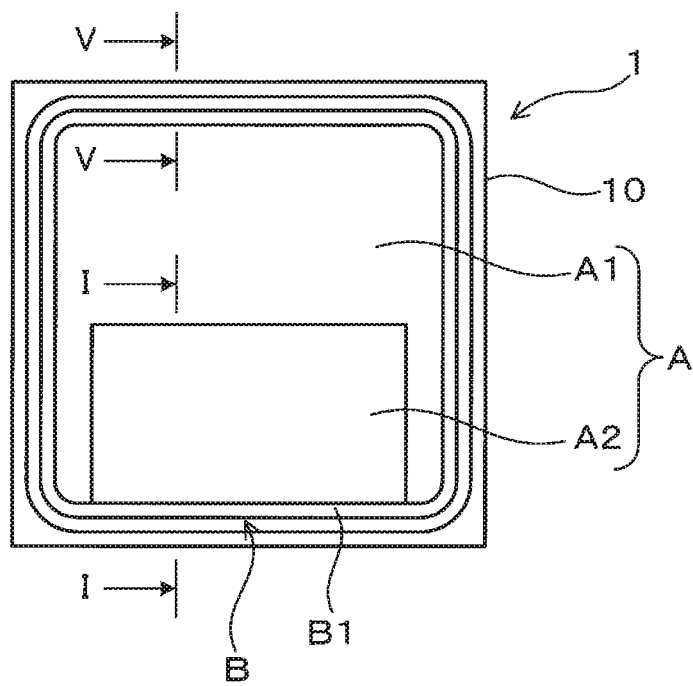
FIG. 2 is a plan view of the semiconductor device according to the first embodiment.

FIGS. 1 and 2 show the overall configuration of a semiconductor device 1 according to the first embodiment.

In the present embodiment, the semiconductor device 1 is configured as an intelligent power element in which both a cell region A1 for forming power elements (i.e., power electronic elements) and a circuit element region A2 for forming circuit elements are provided in the same chip.

Figure 3:
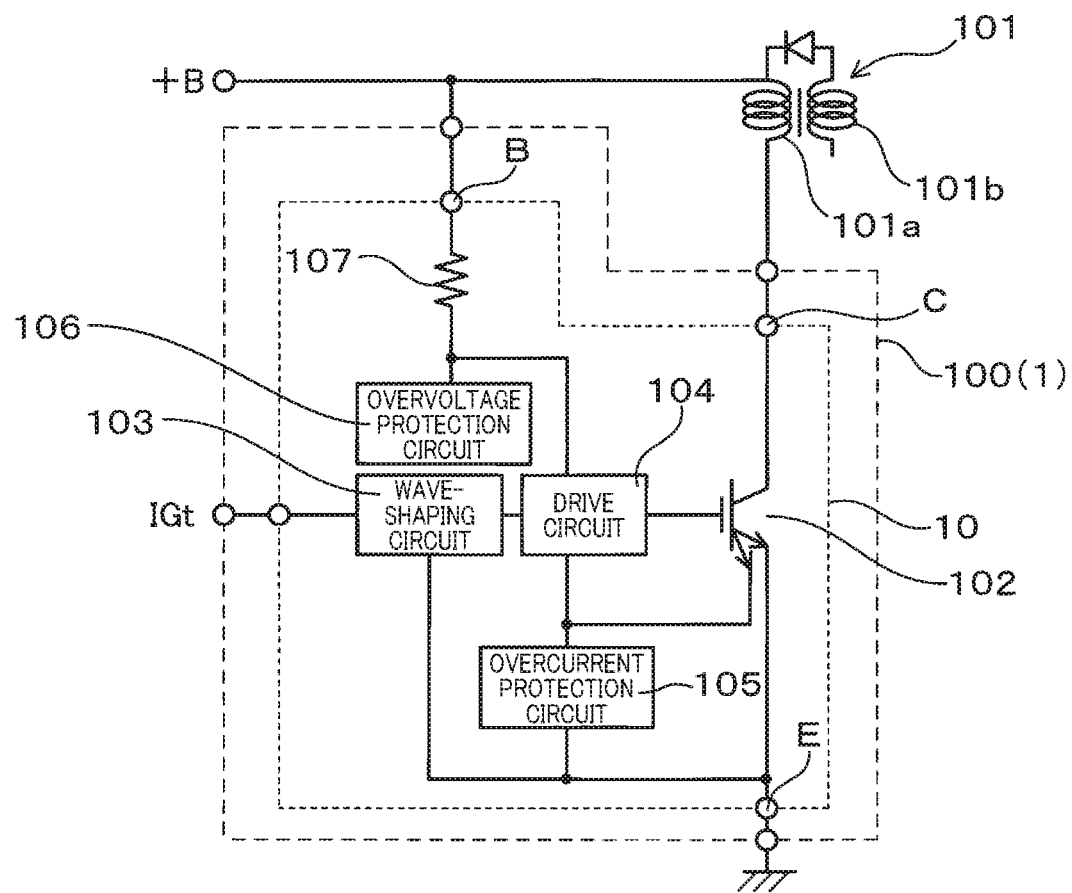
FIG. 3 is a schematic view illustrating the overall configuration of an ignition apparatus for an internal combustion engine, the ignition apparatus including an igniter section that is constituted of the semiconductor device according to the first embodiment.

Moreover, as shown in FIG. 3, the semiconductor device 1 is applied to, for example, an ignition apparatus for an internal combustion engine to constitute an igniter section 100 that controls energization of an ignition coil 101. The igniter section 100 includes a power element 102 (corresponding to the cell region A1) for controlling energization of the ignition coil 101 and circuits (corresponding to the circuit element region A2) for controlling and protecting the power element 102.

As shown in FIG. 1, the semiconductor device 1 includes a single semiconductor substrate 10 that has an n-type drift layer 11 (i.e., a first semiconductor region that is of a first conductive type) formed on a surface thereof. The semiconductor substrate 10 is a p-type substrate (i.e., a substrate that is of a second conductive type).

Hereinafter, the surface (i.e., the upper surface in FIG. 1) of the semiconductor substrate 10 on which the drift layer 11 is formed will be referred to as the major surface 10a; the surface (i.e., the lower surface in FIG. 1) of the semiconductor substrate 10 on the opposite side to the major surface 10a will be referred to as the back surface 10b.

In a surface region of the drift layer 11, there are provided both an element-forming region A and an outer peripheral voltage-withstanding region B. The element-forming region A consists of the cell region A1 and the circuit element region A2. The outer peripheral voltage-withstanding region B is located on the outside (e.g., on the left side in FIG. 1) of both the cell region A1 and the circuit element region A2. The cell region A1 includes a p-type base region 21 (i.e., a second semiconductor region that is of the second conductive type) for forming the power elements. On the other hand, the circuit element region A2 includes a p-type well region 121 (i.e., a third semiconductor region that is of the second conductive type).

As shown in FIG. 2, the outer peripheral voltage-withstanding region B is formed, along the outer peripheral edge of the rectangular (more particularly, the square) semiconductor substrate 10, into the shape of a substantially square loop. The element-forming region A is formed inside the outer peripheral voltage-withstanding region B to have a substantially rectangular (more particularly, square) shape.

In the present embodiment, a rectangular (more particularly, non-square rectangular) part of the element-forming region A located along one side of the semiconductor substrate 10 constitutes the circuit element region A2; the remaining part of the element-forming region A constitutes the cell region A1.

The outer peripheral voltage-withstanding region B, which is substantially square loop-shaped, has four curved corner portions respectively located at four corners of the semiconductor substrate 10 and four straight portions each extending between one pair of the curved corner portions.

The circuit element region A2 is located, for example, to adjoin one of the four straight portions of the outer peripheral voltage-withstanding region B. More particularly, the circuit element region A2 is formed over almost the entire length of the straight portion of the outer peripheral voltage-withstanding region B which the circuit element region A2 adjoins.

As shown in FIG. 2, the circuit element region A2 is interposed between the outer peripheral voltage-withstanding region B and the cell region A1. In the cell region A1, there are arranged cells that form the power element 102 of the igniter section 100 of the ignition apparatus.

The semiconductor substrate 10 is made of a semiconductor material such as Si, SiC, GaN or $Ga_2O_3$. The drift layer 11 is constituted of, for example, an epitaxial growth layer formed on the major surface 10a of the semiconductor substrate 10.

In the cell region A1, there are formed various power elements such as an IGBT, a MOSFET and a thyristor.

For example, in FIG. 1, there are shown IGBT cells 2 that have a planar structure. The IGBT cells 2 have an emitter electrode 13 (i.e., a low-potential electrode) connected to an emitter terminal E (i.e., a first terminal) on the major surface 10a side of the semiconductor substrate 10. Moreover, the IGBT cells 2 also have a collector electrode 14 (i.e., a high-potential electrode) connected to a collector terminal C (i.e., a second terminal) on the back surface 10b side of the semiconductor substrate 10.

In addition, it should be noted that in the case of a MOSFET, the first terminal is a source terminal of the MOSFET and the second terminal is a drain terminal of the MOSFET.

In the circuit element region A2, there are arranged, for example, circuit elements 3 that form the circuits for controlling and protecting the cell region A1. The circuit elements 3 may include, for example, a resistance element, a MOSFET, a capacitive element, a diode and a bipolar transistor. In addition, the circuit elements 3 may be used in any combination according to the configurations of the circuits, such as a combination of different types of the circuit elements 3 or a combination of a plurality of the circuit elements 3 of the same type.

For example, in FIG. 1, there are shown a MOSFET 31 and a resistance element 32. The circuit element region A2, which includes these circuit elements 3, is located between an inner peripheral end of the outer peripheral voltage-withstanding region B and an outer peripheral end of the cell region A1. In the circuit element region A2, there is formed the p-type well region 121 (i.e., the third semiconductor region) in the surface region of the drift layer 11. Moreover, in the p-type well region 121, there are provided the circuit elements 3 including the MOSFET 31 and the resistance element 32. In addition, the configurations of the circuit elements 3 and the IGBT cells 2 will be described in detail later.

As above, providing both the element-forming region A and the outer peripheral voltage-withstanding region B on the common semiconductor substrate 10 and configuring the element-forming region A to include both the cell region A1 and the circuit element region A2, it becomes unnecessary to provide electrical connection between different semiconductor substrates by, for example, wire bonding; it also becomes possible to make the entire semiconductor device 1 compact in size.

On the other hand, since all of the cell region A1, the circuit element region A2 and the outer peripheral voltage-withstanding region B are provided on the common semiconductor substrate 10, the collector electrode 14 may electrically interfere with the circuit element region A2. Moreover, as indicated with a left and right arrow in FIG. 4, the circuit element region A2 and other parts (e.g., the IGBT cells 2 adjacent to the circuit element region A2) may mutually electrically interfere with each other, lowering the surge resistance of the semiconductor device 1.

In view of the above, in the present embodiment, in a boundary region B1 of the outer peripheral voltage-withstanding region B which adjoins the element-forming region A, there are provided voltage-withstanding regions 4A and 4B (i.e., one or more voltage-withstanding regions). The configuration of the boundary region B1 will be described in detail below.

Figure 4:
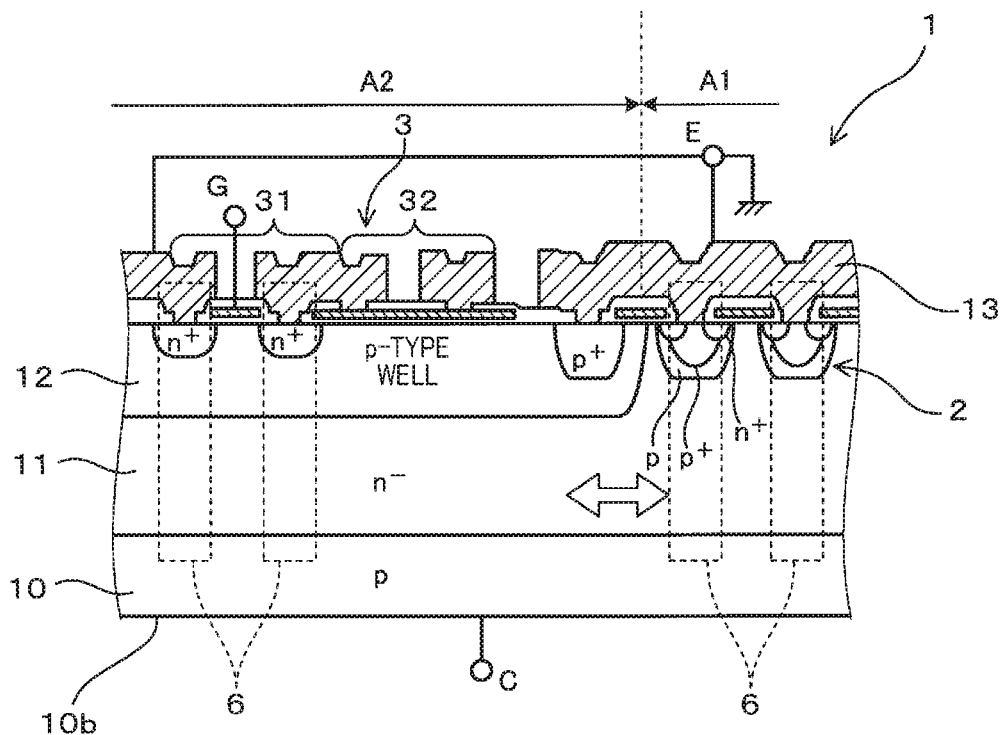
FIG. 4 is an enlarged cross-sectional view of part of the semiconductor device according to the first embodiment, the enlarged cross-sectional view illustrating the relationship between a circuit element region and a cell region in the semiconductor device.

In addition, it should be noted that for the sake of simplicity, the collector electrode 14 provided on the back surface 10b side of the semiconductor substrate 10 is not depicted in the figures from FIG. 4 on.

Referring back to FIG. 1, the outer peripheral voltage-withstanding region B has, in its boundary region B1 adjoining the element-forming region A, a p-type well region 122 (i.e., a fourth semiconductor region that is of the second conductive type) formed in the surface region of the drift layer 11. Moreover, in the boundary region B1, the voltage-withstanding region 4A is located on the outer peripheral side while the voltage-withstanding region 4B is located on the inner peripheral side. At least one of the voltage-withstanding regions 4A and 4B has a withstand voltage set to be lower than both the withstand voltages of the cell region A1 and the circuit element region A2 included in the element-forming region A. Moreover, it is preferable that both (i.e., all) of the voltage-withstanding regions 4A and 4B have a withstand voltage set to be lower than both the withstand voltages of the cell region A1 and the circuit element region A2.

In the outer peripheral voltage-withstanding region B, on the outside of the boundary region B1, there is provided a voltage-withstanding structural part 5 that has, for example, a field-plate structure. The voltage-withstanding structural part 5 is configured to surround the entire element-forming region A.

On the cross section of the semiconductor device 1 shown in FIG. 1 (i.e., the cross section taken along the line I-I in FIG. 2), the boundary region B1 adjoins the circuit element region A2. Moreover, in the boundary region B1, the p-type well region 122 is formed in the surface region of the drift layer 11 integrally with the p-type well region 121 of the circuit element region A2. More specifically, the p-type well region 122 is formed, on the outer peripheral side of the p-type well region 121, at the same depth as the p-type well region 121 so as to be continuous with the p-type well region 121. Consequently, the p-type well region 121 and the p-type well region 122 are integrated into one p-type well region 12. The p-n junction between the p-type well region 12 and the drift layer 11 extends outward from the circuit element region A2 to have an outer peripheral end portion 12a thereof formed at the outer peripheral end of the boundary region B1. Consequently, the electric field in the circuit element region A2 is reduced, thereby suppressing local concentration of electric current in the circuit element region A2.

The voltage-withstanding regions 4A and 4B are provided, in the p-type well region 122 that constitutes the boundary region B1 of the outer peripheral voltage-withstanding region B, to form surge absorption paths outside the circuit element region A2, thereby reducing surge applied to the element-forming region A. More particularly, in the p-type well region 122, the voltage-withstanding region 4A is located on the outer peripheral side (i.e., on the outer peripheral end portion 12a side) while the voltage-withstanding region 4B is located on the inner peripheral side (i.e., on the circuit element region 3 side).

The voltage-withstanding region 4A includes a p-n junction portion between the p-type well region 122 and the n-type drift layer 11, a $p^+$ contact region 42 (i.e., a high-concentration semiconductor region that is of the second conductive type) provided in a surface region of the p-type well region 122, and an electrode portion 41 electrically connected with the $p^+$ contact region 42. Similarly, the voltage-withstanding region 4B includes a p-n junction portion between the p-type well region 122 and the n-type drift layer 11, a $p^+$ contact region 421 (i.e., a high-concentration semiconductor region that is of the second conductive type) provided in the surface region of the p-type well region 122, and an electrode portion 41 electrically connected with the $p^+$ contact region 421.

It should be noted that in the boundary region B1, the voltage-withstanding regions 4A and 4B may have any configuration such that either or both of the voltage-withstanding regions 4A and 4B have a lower withstand voltage than both the cell region A1 and the circuit element region A2 included in the element-forming region A. Moreover, that one of the two voltage-withstanding regions 4A and 4B which has a lower withstand voltage and thus is allowed to be broken down earlier than the other may be either the voltage-withstanding region 4A located on the outer peripheral side or the voltage-withstanding region 4B located on the inner peripheral side.

For example, in the p-type well region 122, the electric field strength becomes high in the vicinity of the outer peripheral end portion 12a. Therefore, when the outer peripheral end portion 12a is configured to have an edge 12b as shown in FIG. 1, it is easy for breakdown to occur in the voltage-withstanding region 4A due to the electric field concentration. That is, configuring the outer peripheral end portion 12a to have the edge 12b, the withstand voltage of the voltage-withstanding region 4A is lowered, thereby facilitating the formation of a surge absorption path that passes through the voltage-withstanding region 4A.

Moreover, in the above case, it is possible to adjust the withstand voltage of the voltage-withstanding region 4A by adjusting the curvature of the p-type well region 122 at the edge 12b of the outer peripheral end portion 12a. More specifically, it is possible to lower the withstand voltage of the voltage-withstanding region 4A by reducing the curvature of the p-type well region 122 at the edge 12b, thereby allowing the voltage-withstanding region 4A to be broken down first in the semiconductor device 1. Consequently, it is possible to significantly reduce the surge current flowing to the circuit element region A2, thereby preventing the circuit element region A2 from being broken down.

On the other hand, it is possible to lower the withstand voltage of the voltage-withstanding region 4B by forming the $p^+$ contact region 421 to be deeper than the $p^+$ contact region 42. For example, as shown in FIG. 1, it is possible to set the depth of the $p^+$ contact region 421 to be so large as to reach the bottom of the p-type well region 12. Consequently, it is possible to cause the surge current to flow from the drift layer 11 directly into the $p^+$ contact region 421, thereby facilitating the formation of a surge absorption path that passes through the voltage-withstanding region 4B. In addition, it is also possible to further deepen the $p^+$ contact region 421 beyond the bottom of the p-type well region 12 so as to be exposed to the n-type drift layer 11, thereby further lowering the withstand voltage of the voltage-withstanding region 4B.

Furthermore, it is also possible to combine the above-described configurations of the voltage-withstanding regions 4A and 4B, thereby increasing the surge absorption area in the semiconductor device 1. Consequently, it is possible to prevent lath-up breakdown from occurring in the semiconductor device 1 even when a higher-voltage surge is applied to the semiconductor device 1.

It should be noted that the withstand voltages of the voltage-withstanding regions 4A and 4B may also be lowered by other methods than the above-described methods of adjusting the curvature of the p-type well region 122 at the edge 12b and adjusting the depth of the p$^+$ contact region 421.

In addition, as shown in FIG. 1, the depth of the p-type well region 12 is set to be constant in both the circuit element region A2 and the boundary region B1. The p-n junction between the p-type well region 12 and the n-type drift layer 11 has a substantially planar shape except at the end portions thereof.

The electrode portions 41 provided in the voltage-withstanding regions 4A and 4B are made, for example, of a metal material such as an aluminum alloy. The electrode portions 41 are connected to the emitter electrode 13 (i.e., the low-potential electrode) provided in the cell region A1. The emitter terminal E (i.e., the first terminal), to which the emitter electrode 13 is connected, is grounded. Consequently, the voltage-withstanding regions 4A and 4B are electrically connected, via their respective surge absorption portions (i.e., those portions enclosed with dashed lines in FIG. 1), to the emitter electrode 13, forming the surge absorption paths. Here, the surge absorption portion of the voltage-withstanding region 4A is constituted of both the p$^+$ contact region 42 and the electrode portion 41 provided in the voltage-withstanding region 4A; the surge absorption portion of the voltage-withstanding region 4B is constituted of both the p$^+$ contact region 421 and the electrode portion 41 provided in the voltage-withstanding region 4B.

In addition, as shown in FIG. 1, a p$^+$ contact region 16 is provided in a surface region of an inner peripheral end portion of the p-type well region 12; the inner peripheral end portion of the p-type well region 12 adjoins the cell region A1. The p$^+$ contact region 16 is connected with an extension of the emitter electrode 13 which extends outward into the circuit element region A2.

Figure 5:
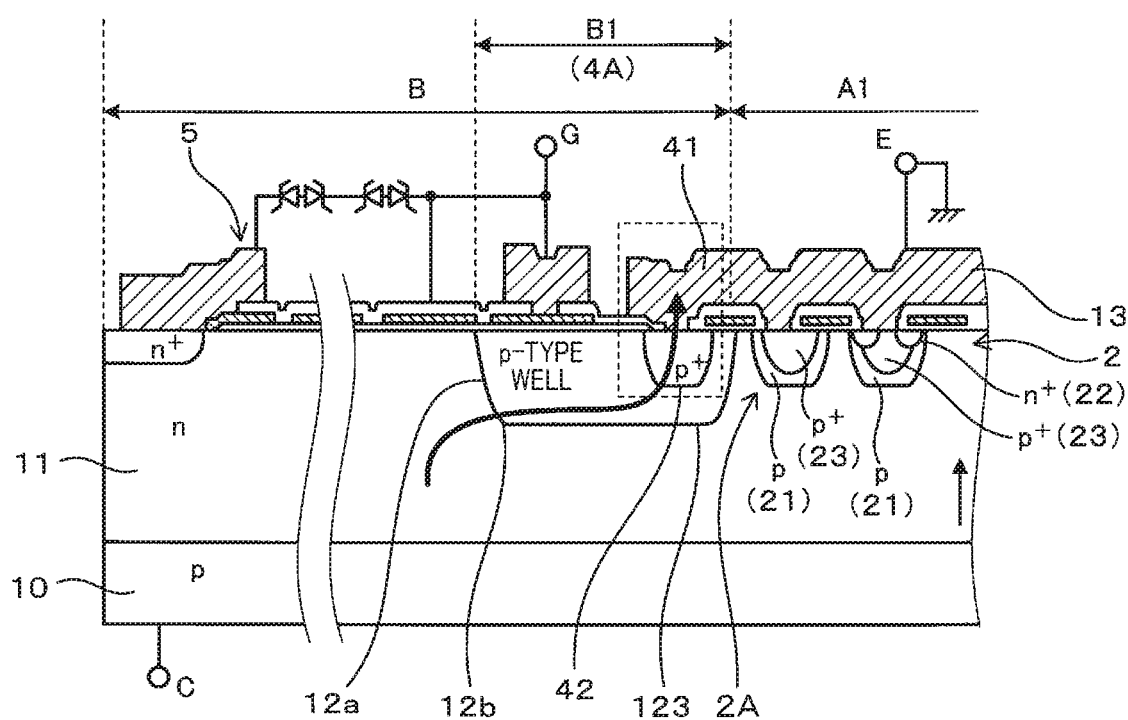
FIG. 5 is an enlarged cross-sectional view, taken along the line V-V in FIG. 2, of part of the semiconductor device according to the first embodiment.

On the cross section of the semiconductor device 1 shown in FIG. 5 (i.e., the cross section taken along the line V-V in FIG. 2), there is no circuit element region A2 interposed between the boundary region B1 of the outer peripheral voltage-withstanding region B and the cell region A1; thus the boundary region B1 directly adjoins the outer peripheral end of the cell region A1. In this case, in the boundary region B1, there is formed a p-type well region 123 (i.e., the fourth semiconductor region) in the surface region of the drift layer 11. Moreover, in the p-type well region 123, there is formed a voltage-withstanding region 4A (i.e., one or more voltage-withstanding regions). The voltage-withstanding region 4A has a withstand voltage set to be lower than both the withstand voltages of the cell region A1 and the circuit element region A2 included in the element-forming region A. On the outside of the voltage-withstanding region 4A, there is provided the voltage-withstanding structural part 5.

More specifically, as shown in FIG. 5, the voltage-withstanding region 4A includes a p-n junction portion between the p-type well region 123 and the n-type drift layer 11, a p$^+$ contact region 42 (i.e., a high-concentration semiconductor region that is of the second conductive type) provided in a surface region of the p-type well region 123, and an electrode portion 41 electrically connected with the p$^+$ contact region 42. That is, the voltage-withstanding region 4A shown in FIG. 5 has the same configuration as the voltage-withstanding region 4A shown in FIG. 1. Therefore, in the case of the voltage-withstanding region 4A shown in FIG. 5, it is also possible to lower the withstand voltage of the voltage-withstanding region 4A by, for example, adjusting the curvature of the p-type well region 123 at an edge 12b of an outer peripheral end portion 12a of the p-n junction portion between the p-type well region 123 and the n-type drift layer 11.

In addition, it should be noted that a voltage-withstanding region 4B as shown in FIG. 1 may also be provided on the inner peripheral side of the voltage-withstanding region 4A shown in FIG. 5.

Moreover, the electrode portion 41 of the voltage-withstanding region 4A shown in FIG. 5 is formed integrally with the emitter electrode 13 (i.e., the low-potential electrode) provided in the cell region A1. Consequently, the voltage-withstanding region 4A is electrically connected, via its surge absorption portion (i.e., the portion enclosed with a dashed line in FIG. 5), to the emitter electrode 13, forming a surge absorption path outside the cell region A1. Here, the surge absorption portion of the voltage-withstanding region 4A is constituted of both the p$^+$ contact region 42 and the electrode portion 41 provided in the voltage-withstanding region 4A.

Referring back to FIG. 1, the voltage-withstanding structural part 5 is constituted of a field oxide film 51, a plurality of ring-shaped field plates 52 and a plurality of Zener diode pairs 53. The field oxide film 51 is formed on the surface region of the drift layer 11. The field plates 52 are arranged on the field oxide film 51 so as to be spaced from each other. Each of the Zener diode pairs 53 is located between one adjacent pair of the field plates 52. The field oxide film 51 and the field plates 52 are covered with an interlayer dielectric film 54. One of the field plates 52 which is located innermost is electrically connected to a field-plate electrode 55 via a contact hole that is formed through the interlayer dielectric film 54 and located above the innermost field plate 52. Moreover, the field-plate electrode 55 is electrically connected to a gate terminal G of the element-forming region A. On the other hand, one of the field plates 52 which is located outermost has an outer peripheral end portion thereof exposed from the interlayer dielectric film 54; on the outer peripheral end portion, there is arranged an equipotential plate 56. The outermost field plate 52 is electrically connected, via the equipotential plate 56, to an n$^+$ contact region 57 that is formed in a surface region of the drift layer 11.

The field plates 52 are made, for example, of polysilicon or a metal material. Each of the Zener diode pairs 53 is constituted of two Zener diodes that are reversely connected. Moreover, each of the Zener diodes is made by, for example, injecting impurities of different conductive types (i.e., p-type and n-type) alternately into polysilicon.

The voltage-withstanding structural part 5 regulates the electric field distribution in the semiconductor device 1 by means of the field plates 52, and obtains a desired withstand voltage by the combined use of the field plates 52 and the Zener diode pairs 53 that break down when subjected to overvoltage.

In addition, in the exemplary embodiments described hereinbelow including the present embodiment, the first conductive type is n-type and the second conductive type is p-type. However, the first conductive type may alternatively be p-type and the second conductive type may alternatively be n-type. The shapes and dimensions of the semiconductor substrate 10 and various regions are not particularly limited, but may be suitably changed according to the use of the semiconductor device 1.

In the cell region A1, each of the IGBT cells 2 includes a collector layer that is constituted of the p-type semiconductor substrate 10, the p-type base region 21 formed in a surface region of the n-type drift layer 11, and n+-type semiconductor regions 22 that are formed in a surface region of the p-type base region 21 to constitute an emitter region. In the p-type base region 21, between each adjacent pair of the n+-type semiconductor regions 22, there is formed a $p^+$-type semiconductor region 23 that constitutes a base contact region. On the n+-type semiconductor regions 22 and the p-type base region 21, there is arranged a gate electrode 15 via a gate dielectric film 24. In the p-type base region 21 below the gate electrode 15, there is formed a channel region. The gate electrode 15 is made, for example, of polysilicon and connected to the gate terminal G via not-shown gate wiring.

On the gate electrode 15, there is arranged the emitter electrode 13 (i.e., the low-potential electrode) via an interlayer dielectric film 25; the emitter electrode 13 is connected to the emitter terminal E (i.e., the first terminal). Moreover, the emitter electrode 13 is electrically connected, via a contact hole formed in the interlayer dielectric film 25, to the n+-type semiconductor regions 22 and the p+-type semiconductor region 23. On the back surface 10b side of the semiconductor substrate 10 (i.e., on the opposite side to the major surface 10a), there is formed the collector electrode 14 (i.e., the high-potential electrode); the collector electrode 14 is connected to the collector terminal C (i.e., the second terminal). The emitter electrode 13 and the collector electrode 14 are made, for example, of a metal material such as an aluminum alloy.

The cell region A1 of the element-forming region A includes each IGBT cell 2 having the above-described configuration as a basic unit. The IGBT cells 2 are arranged in the cell region A1 to realize desired characteristics of the IGBT (or the power element 102 shown in FIG. 3). In addition, the configuration of the IGBT cells 2 may be suitably changed. For example, the IGBT cells 2 may alternatively have a trench structure.

Moreover, as shown in FIG. 5, the cell region A1 also includes, in addition to the IGBT cells 2 (i.e., first cells), second cells 2A that have no parasitic transistor structure. Specifically, the second cells 2A have a structure obtained by removing the $n^+$-type semiconductor regions 22 from the structure of the IGBT cells 2. That is, each of the second cells 2A includes a p-type base region 21 and a $p^+$-type semiconductor region 23. Since the second cells 2A have no $n^+$-type semiconductor regions 22 in the p-type base region 21, there is no parasitic transistor structure formed in the second cells 2A. In the cell region A1, the second cells 2A are arranged at least in a first row that is immediately adjacent to the boundary region B1 and the IGBT cells 2 are arranged inside the first row. With this arrangement, it becomes possible to more effectively suppress latch-up operation of the IGBT cells 2. Moreover, when the voltage-withstanding region 4A is broken down, the second cells 2A form surge absorption paths, increasing the surge absorption area in the semiconductor device 1.

Referring now to FIG. 3, the semiconductor device 1 having the above-described structure is applied to the ignition apparatus to constitute the igniter section 100 that controls energization of the ignition coil 101. The igniter section 100 includes the power element 102 that is constituted of the cell region A1 of the semiconductor device 1.

As shown in FIG. 3, the ignition coil 101 includes a primary coil 101a and a secondary coil 101b. The primary coil 101a has one end connected to a positive terminal +B of a battery and the other end connected to the collector terminal C of the power element 102. The emitter terminal E of the power element 102 is grounded.

In the present embodiment, the power element 102 is provided on the same semiconductor substrate 10 as the circuits for controlling and protecting the power element 102. These circuits include, for example, a wave-shaping circuit 103, a drive circuit 104, an overcurrent protection circuit 105, an overvoltage protection circuit 106 and a resistor 107 for noise absorption.

In operation, an ignition signal IGt is outputted from a control apparatus (not shown) of the internal combustion engine to the igniter section 100. The ignition signal IGt is then wave-shaped by the wave-shaping circuit 103 into a binary signal that has two distinguishable levels, i.e., a high level and a low level. Further, the binary signal is inputted to the drive circuit 104. Then, in accordance with the inputted binary signal, the drive circuit 104 outputs a gate voltage to the power element 102, thereby on-off driving the power element 102. Consequently, supply of electric current to the primary coil 101a of the ignition coil 101 is selectively allowed and interrupted, inducing a high ignition voltage in the secondary coil 101b.

The overcurrent protection circuit 105 is connected to a sense emitter terminal of the power element 102. The overcurrent protection circuit 105 detects primary current flowing in the primary coil 101a of the ignition coil 101. When the detected primary current is excessive, the overcurrent protection circuit 105 limits or interrupts the primary current, thereby protecting the power element 102 from overcurrent.

The overvoltage protection circuit 106 is connected to a power terminal B of the igniter section 100; the power terminal B is connected to the positive terminal +B of the battery. The overvoltage protection circuit 106 protects the power element 102 from overvoltage caused by variation in the output voltage of the battery.

The above-described circuits 103-106 are formed of the circuit elements 3 provided in the circuit element region A2 of the semiconductor device 1. The circuit elements 3 include, for example, the MOSFET 31 and the resistance element 32 as shown in FIG. 1.

The MOSFET 31 includes the p-type well region 121 (i.e., the third semiconductor region) formed in the surface region of the n-type drift layer 11. The MOSFET 31 also includes an $n^+$-type source layer 31a and an $n^+$-type drain layer 31b both of which are formed in a surface region of the p-type well region 121. On the $n^+$-type source layer 31a and the $n^+$-type drain layer 31b, there is arranged a gate electrode 34 via a gate dielectric film 33. The gate electrode 34 is made, for example, of polysilicon and connected to the gate terminal G via not-shown gate wiring. Moreover, on the $n^+$-type source layer 31a and the $n^+$-type drain layer 31b, there are respectively arranged a source electrode 35a and a drain electrode 35b via an interlayer dielectric film 36. The source electrode 35a and the drain electrode 35b are made, for example, of a metal material such as an aluminum alloy. The source electrode 35a and the drain electrode 35b are respectively electrically connected to the $n^+$-type source layer 31*a* and the n⁺-type drain layer 31*b* via contact holes formed in the interlayer dielectric film 36.

The resistance element 32 includes a resistor 38 and a wiring portion 39. The resistor 38 is arranged on the p-type well region 121 via an interlayer dielectric film 37. The wiring portion 39 is arranged on the resistor 38 via another interlayer dielectric film 37. The resistor 38 is made, for example, of polysilicon. The resistor 38 is electrically connected to the wiring portion 39 via a contact hole that is formed in the interlayer dielectric film 37 interposed between the resistor 38 and the wiring portion 39. The wiring portion 39 is connected to the source electrode 35*a* and the drain electrode 35*b* of the MOSFET 31 and other not-shown circuit elements 3, forming a desired circuit.

Next, the voltage-withstanding structure of the igniter section 100 of the ignition apparatus, which is constituted of the semiconductor device 1 according to the present embodiment, will be described.

Upon the high-level gate voltage being outputted from the drive circuit 104, the power element 102, which is constituted of the IGBT cells 2 of the semiconductor device 1, is turned on, allowing the primary current (or collector current) to flow through the primary coil 101*a* of the ignition coil 101. Further, upon the low-level gate voltage being outputted from the drive circuit 104, the power element 102 is turned off, interrupting the primary current and thereby causing a high secondary voltage (i.e., ignition voltage) to be generated in the secondary coil 101*b* of the ignition coil 101. At this time, a high back electromotive force is generated in the primary coil 101*a* of the ignition coil 101 and applied between the collector and the emitter of the power element 102 (i.e., the IGBT cells 2). Therefore, in the igniter section 100 that has the inductive load (i.e., the ignition coil 101), there is formed the voltage-withstanding structural part 5 in the outer peripheral voltage-withstanding region B so as to secure a sufficient withstand voltage for the switching and the operation of the circuits.

Figure 6:
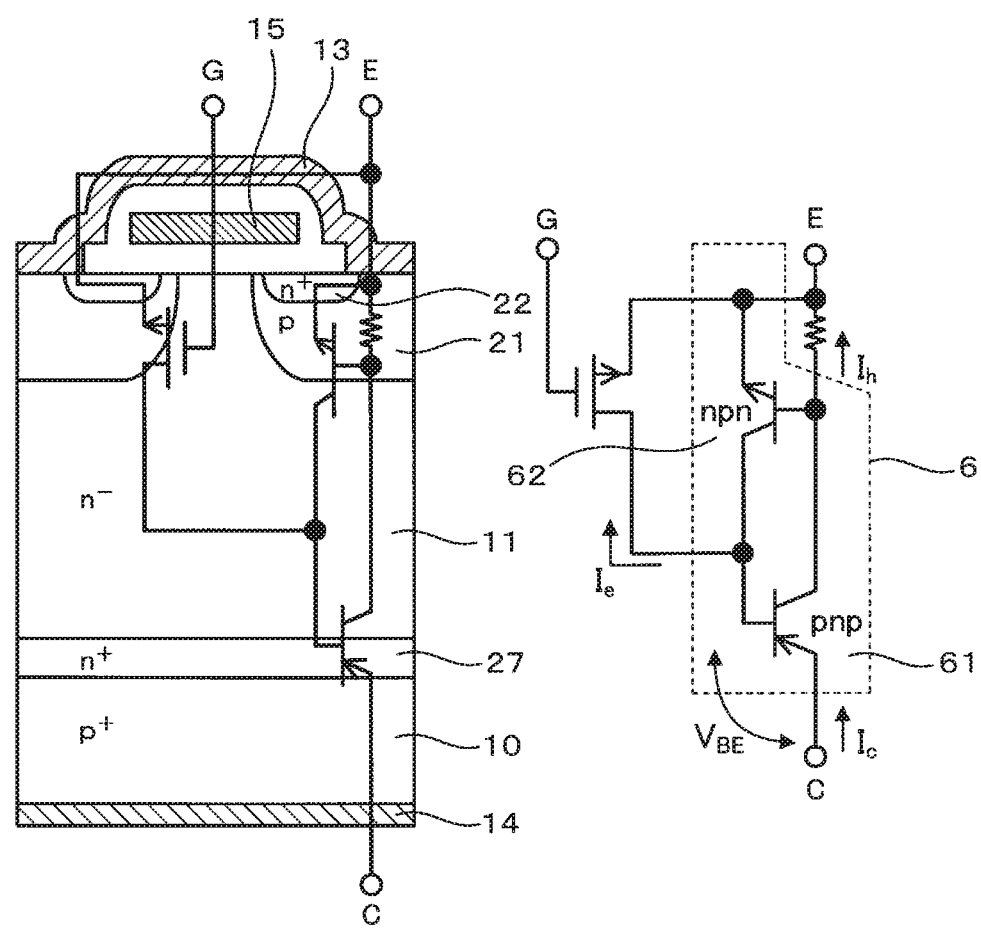
FIG. 6 is a schematic view illustrating the structure and equivalent circuit of IGBT cells that constitute the cell region of the semiconductor device according to the first embodiment.

On the other hand, there are cases where a high-speed and high-voltage surge due to an electrostatic discharge is applied to the igniter section 100 (i.e., the semiconductor device 1). As shown in FIG. 6, the IGBT cells 2, which constitute the power element 102 of the igniter section 100, include a parasitic element 6 that has a pnpn thyristor structure. More specifically, the parasitic element 6 has a pnp transistor 61 on the collector electrode 14 side and an npn transistor 62 on the emitter electrode 13 side. When a surge voltage of high dV/dt is generated and thus surge current flows against the base-emitter resistance RBE of the npn transistor 62, the npn transistor 62 is turned on. Consequently, a latch-up phenomenon occurs where electric current continuously flows from the collector terminal C to the emitter terminal E. Similarly, in the cases where a parasitic element is formed in the circuit element region A2 of the semiconductor device 1, a latch-up phenomenon may also occur. Accordingly, it is necessary to prevent a latch-up phenomenon from occurring in either or both of the cell region A1 and the circuit element region A2 of the semiconductor device 1.

In addition, the IGBT cells 2 shown in FIG. 6 have a configuration where on the p⁺-type semiconductor substrate 10 that constitutes the collector layer, there is formed the n⁻-type drift layer 11 via an n⁺-type buffer layer 27. With this configuration, it is possible to reduce the thickness of the n⁻-type drift layer 11, thereby suppressing increase in the stored carriers and reducing the turn-off loss. As described above, the configurations of the IGBT cells 2 and the circuit elements 3 provided in the element-forming region A are not particularly limited.

As shown in FIGS. 1 and 2, in the semiconductor device 1 according to the present embodiment, the outer peripheral voltage-withstanding region B includes the boundary region B1 that surrounds the element-forming region A. In the boundary region B1 where no parasitic element 6 exists, there are provided the voltage-withstanding regions 4A and 4B to form the surge absorption paths. The voltage-withstanding regions 4A and 4B are located on the outer peripheral side of the circuit element region A2 and absorb surge by having the p-n junction between the p-type well region 122 and the n-type drift layer 11 break down earlier than the element-forming region A.

More specifically, in the present embodiment, the p-type well region 121 of the circuit element region A2 is formed integrally with the p-type well region 122 of the boundary region B1. The p-n junction between the p-type well region 122 and the n-type drift layer 11 extends outward from the circuit element region A2 to have its outer peripheral end portion 12*a* located under the field-plate electrode 55 of the voltage-withstanding structural part 5. Consequently, the electric field is relaxed in the vicinity of the element-forming region A while being concentrated in the vicinity of the outer peripheral end portion 12*a*. As a result, breakdown occurs in that one of the voltage-withstanding regions 4A and 4B which has a lower withstand voltage than the other, for example occurs at the edge 12*b* of the outer peripheral end portion 12*a* located in the voltage-withstanding region 4A, causing a large surge current to flow as shown with a thick line in FIG. 1.

Moreover, the surge absorption path in the p-type well region 122 is a relatively short path extending from the edge 12*b* to the p⁺ contact region 42 located under the electrode portion 41. On the other hand, as shown in FIG. 5, in that part of the boundary region B1 which adjoins the cell region A1, there is provided the voltage-withstanding region 4A that has the same configuration as the voltage-withstanding region 4A shown in FIG. 1. Accordingly, the surge absorption path formed in the voltage-withstanding region 4A shown in FIG. 5 is identical to the surge absorption path formed in the voltage-withstanding region 4A shown in FIG. 1.

That is, in the present embodiment, the voltage-withstanding region 4A is uniformly formed around the entire element-forming region A that includes the cell region A1 and the circuit element region A2. Consequently, it becomes possible to uniformly absorb surge on the outer peripheral side of the entire element-forming region A.

Moreover, by further providing the voltage-withstanding region 4B in addition to the voltage-withstanding region 4A in the boundary region B1 and the second cells 2A in addition to the IGBT cells 2 in the cell region A1, it becomes possible to absorb larger surge current, thereby more reliably preventing breakdown of the semiconductor device 1.

More specifically, as shown with thin-line arrows in FIGS. 1 and 5, it becomes possible to significantly reduce the surge current flowing to the cell region A1 and the circuit element region A2. Consequently, it becomes possible to make the density of the breakdown current flowing into the cell region A1 and the circuit element region A2 lower than the allowable current densities of the cell region A1 and the circuit element region A2. As a result, it becomes possible to prevent thermal damage to the semiconductor device 1 due to a latch-up phenomenon, reduce the size of the semiconductor device 1 and ensure high reliability of the semiconductor device 1.

Figure 7:
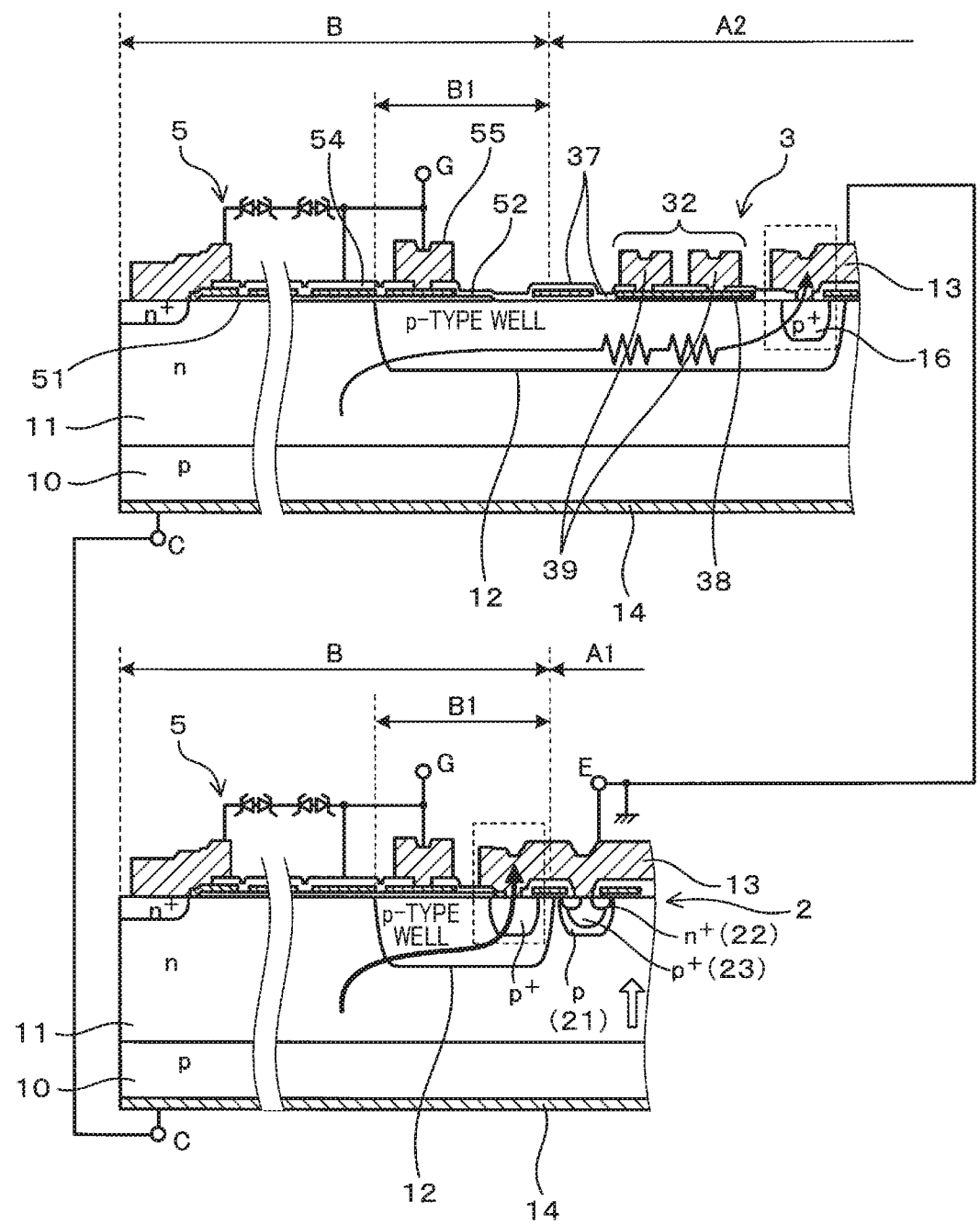
FIG. 7 includes two enlarged cross-sectional views of different parts of a semiconductor device according to a first comparative example, the two enlarged cross-sectional views respectively corresponding to the enlarged cross-sectional views shown in FIGS. 1 and 5.

In contrast, in a first comparative example shown in FIG. 7, in the boundary region B1 of the outer peripheral voltage-withstanding region B which adjoins the element-forming region A, there is provided neither the voltage-withstanding region 4A nor the voltage-withstanding region 4B. Therefore, breakdown may occur in the element-forming region A.

Specifically, as shown in the upper cross-sectional view of FIG. 7, in that part of the boundary region B1 which adjoins the circuit element region A2, the p-type well region 12 is formed integrally with the p-type well region 12 formed in the circuit element region A2. Moreover, on the p-type well region 12 formed in the boundary region B1, there is arranged the innermost field plate 52 via the field oxide film 51. The innermost field plate 52 is covered with the interlayer dielectric film 54 and electrically connected to the field-plate electrode 55 via the contact hole formed in the interlayer dielectric film 54.

On the p-type well region 12 formed in the circuit element region A2, there is arranged the resistor 38 via one interlayer dielectric film 37; the resistor 38 is made, for example, of polysilicon. Moreover, on the resistor 38, there is arranged the wiring portion 39 via another interlayer dielectric film 37. The resistor 38 is electrically connected to the wiring portion 39 via the contact hole that is formed in the interlayer dielectric film 37 interposed between the resistor 38 and the wiring portion 39. It should be noted that the circuit element region A2 is only briefly shown in the upper cross-sectional view of FIG. 7. On the opposite side of the circuit element region A2 to the outer peripheral voltage-withstanding region B, there are provided the IGBT cells 2 of the cell region A1 (not shown in the upper cross-sectional view of FIG. 7) adjacent to the circuit element region A2. In addition, the p$^+$ contact region 16 is provided in the surface region of the inner peripheral end portion of the p-type well region 12 and connected to the emitter electrode 13.

In the boundary region B1, there are arranged neither the electrode portions 41 and nor the p$^+$ contact regions 42 and 421 on the p-type well region 12. That is, in the boundary region B1, there is provided neither the voltage-withstanding region 4A nor the voltage-withstanding region 4B.

On the other hand, as shown in the lower cross-sectional view of FIG. 7, that part of the boundary region B1 which directly adjoins the cell region A1 has the IGBT cells 2 arranged adjacent thereto.

In the above-described first comparative example, when a surge is applied to the collector electrode 14, there occurs a bias in the surge current flowing into the p-type well region 12 depending on whether or not there is interposed the circuit element region A2 between the boundary region B1 and the cell region A1.

Specifically, as shown in the upper cross-sectional view of FIG. 7, with the circuit element region A2 interposed between the boundary region B1 and the cell region A1, the surge current flows into the p-type well region 12 from the outer peripheral end portion 12a of the p-n junction between the p-type well region 12 and the n-type drift layer 11. Then, the surge current flows through the p-type well region 12 along a long surge-absorption path from the outer peripheral end portion 12a to the emitter electrode 13 located at the boundary between the circuit element region A2 and the cell region A1. Along the long surge-absorption path, the resistance to the surge current is high. Therefore, as shown with a thin-line arrow in the upper cross-sectional view of FIG. 7, only a small amount of the surge current flows through the p-type well region 12 along the long surge-absorption path.

In contrast, as shown in the lower cross-sectional view of FIG. 7, without the circuit element region A2 interposed between the boundary region B1 and the cell region A1, the surge current flows through the p-type well region 12 along a short surge-absorption path. Along the short surge-absorption path, the resistance to the surge current is low. Therefore, as shown with a thick-line arrow in the lower cross-sectional view of FIG. 7, a large amount of the surge current flows through the p-type well region 12 along the short surge-absorption path.

Accordingly, in the first comparative example, the impedance between the emitter terminal E and the collector terminal C at that part of the boundary region B1 which adjoins the cell region A1 is considerably different from the impedance between the emitter terminal E and the collector terminal C at that part of the boundary region B1 which adjoins the circuit element region A2. When the large amount of the surge current flows along the short surge-absorption path as shown with the thick-line arrow in the lower cross-sectional view of FIG. 7, a number of carriers present in the vicinity of the short surge-absorption path may flow into the cell region A1. Consequently, the density of electric current flowing into the cell region A1 may exceed the allowable current density of the cell region A1, causing latch-up damage to the cell region A1.

The above first comparative example, in which no voltage-withstanding region is provided in the boundary region B1, may be modified to have a low-withstand voltage region formed in part of the element-forming region A, thereby absorbing surge.

Figure 8:
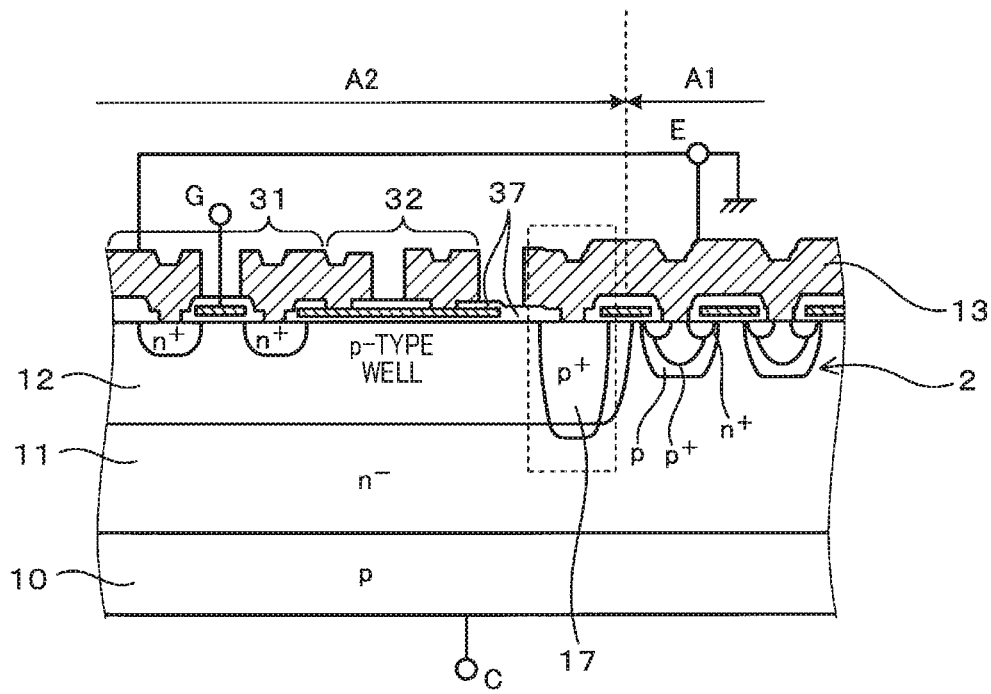
FIG. 8 is an enlarged cross-sectional view of part of a semiconductor device according to a second comparative example.

For example, in a second comparative example shown in FIG. 8, in the circuit element region A2, there is provided a p$^+$-type semiconductor layer 17 so as to overlap an inner peripheral end portion of the p-type well region 12. The p$^+$-type semiconductor layer 17 is formed to be deeper than the p-type well region 12, thereby reaching the n$^-$-type drift layer 11. On the p$^+$-type semiconductor layer 17, there is arranged the emitter electrode 13 via an interlayer dielectric film 37. Moreover, the p$^+$-type semiconductor layer 17 is in direct contact with the emitter electrode 13 via a contact hole formed in the interlayer dielectric film 37. The p-n junction between the p$^+$-type semiconductor layer 17 and the n$^-$-type drift layer 11 has a greater impurity gradient and thus a lower withstand voltage than the p-n junction between the p-type well region 12 and the n$^-$-type drift layer 11.

In the above-described second comparative example, when a surge is applied to the collector electrode 14, the surge current flows into the p$^+$-type semiconductor layer 17 and is then absorbed via a surge absorption path extending to the emitter electrode 13. However, to reduce the surge current flowing to a specific element in the circuit element region A2, it is necessary to secure a location and a necessary area for providing the low-withstand voltage region in the vicinity of the specific element. Here, the specific element denotes an element into which it is easy for the surge current flows or an element which may be easily damaged due to a latch-up phenomenon. Therefore, there are layout constraints in providing the low-withstand voltage region in the circuit element region A2. Consequently, due to the layout constraints, it may be impossible to improve the latch-up resistance of the semiconductor device.

In comparison, according to the present embodiment, it is possible to secure a sufficient surge absorption area in the semiconductor device 1, thereby making it possible to improve the surge resistance of the semiconductor device 1 while reducing the size of the same.

Second Embodiment

In the semiconductor device 1 according to the previous embodiment, in the element-forming region A, the shape, size and location of the circuit element region A2 are not particularly limited, but may be suitably modified. Moreover, in the boundary region B1, the number, configuration and location of the voltage-withstanding regions are not particularly limited, but may be suitably modified.

Figure 9:
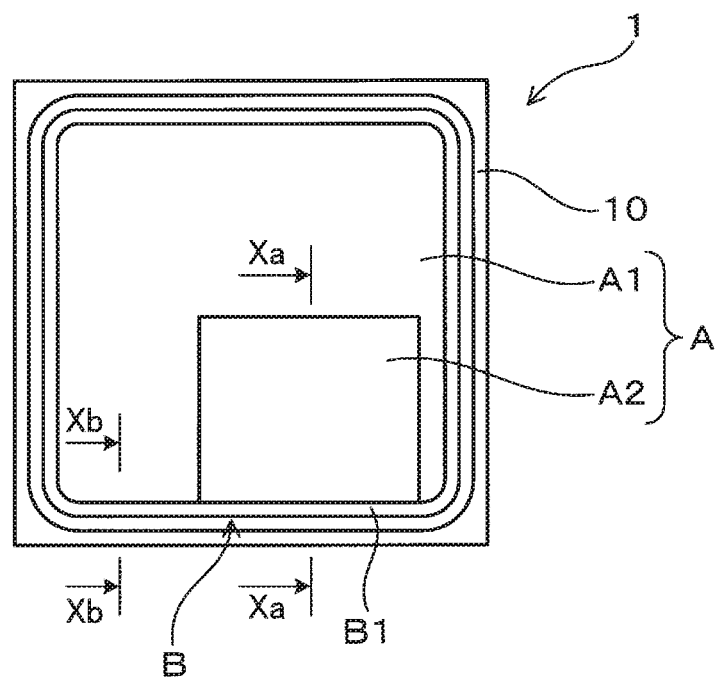
FIG. 9 is a plan view of a semiconductor device according to a second embodiment.

For example, as shown in FIG. 9, in a semiconductor device 1 according to the second embodiment, the circuit element region A2 is substantially square in shape. The circuit element region A2 is located inside the outer peripheral voltage-withstanding region B, which is substantially square loop-shaped, and close to one of the four curved corner portions of the outer peripheral voltage-withstanding region B. Moreover, the circuit element region A2 adjoins one of the four straight portions of the outer peripheral voltage-withstanding region B over more than half of the entire length of the straight portion. The remaining part of the element-forming region A, where no circuit element region A2 is formed, constitutes the cell region A1. In addition, the cell region A1 and the circuit element region A2 may have the same basic configurations as those described in the first embodiment.

Figure 10:
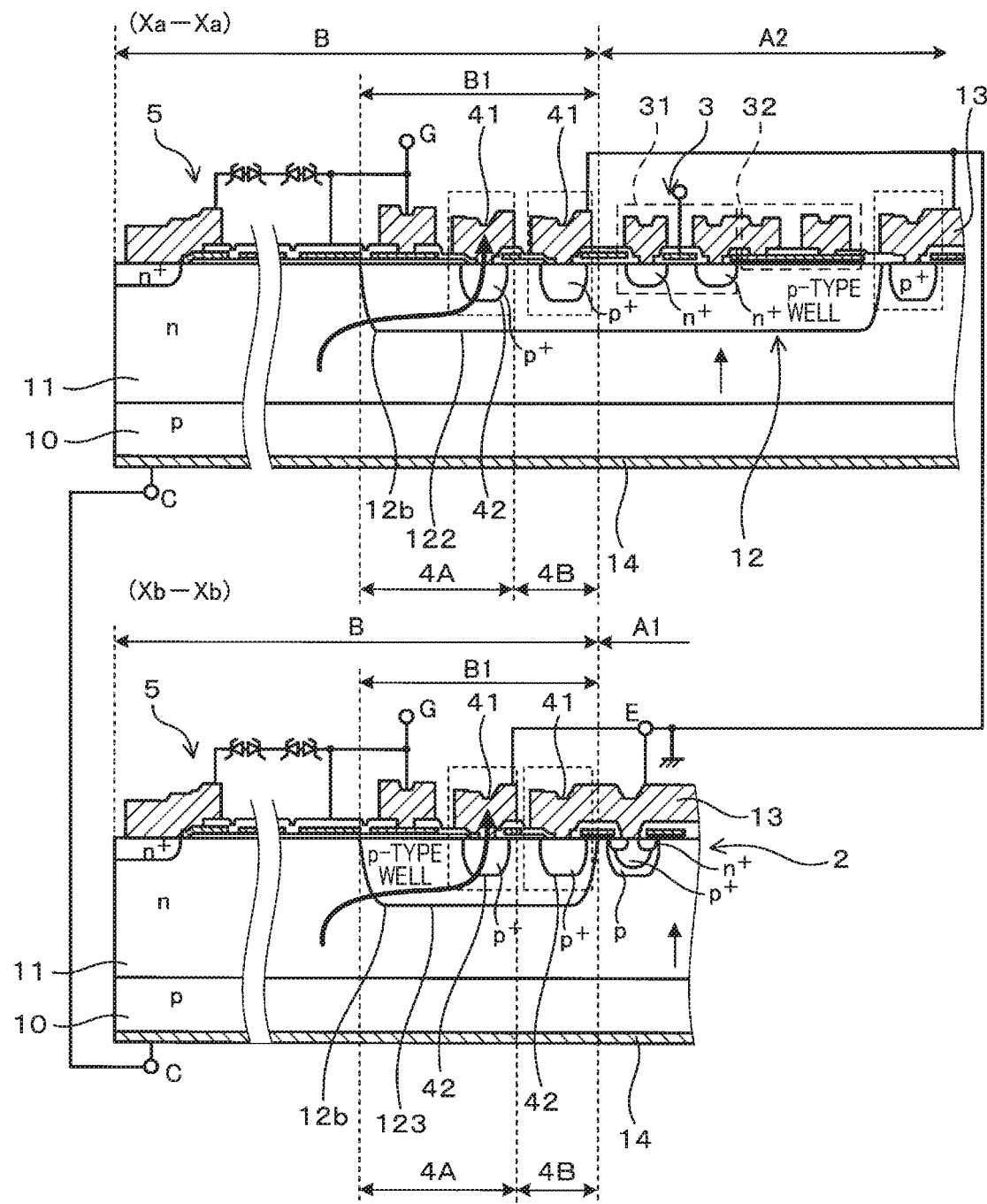
FIG. 10 includes two enlarged cross-sectional views of different parts of the semiconductor device according to the second embodiment, the two enlarged cross-sectional views being respectively taken along the lines Xa-Xa and Xb-Xb in FIG. 9.

Moreover, in the present embodiment, as shown in the upper cross-sectional view of FIG. 10, both the voltage-withstanding regions 4A and 4B are provided in that part of the boundary region B1 of the outer peripheral voltage-withstanding region B which adjoins the circuit element region A2. Moreover, as shown in the lower cross-sectional view of FIG. 10, both the voltage-withstanding regions 4A and 4B are also provided in that part of the boundary region B1 of the outer peripheral voltage-withstanding region B which adjoins the cell region A1.

That is, in the present embodiment, both the voltage-withstanding regions 4A and 4B are configured to surround the entire element-forming region A. In addition, at least one of the voltage-withstanding regions 4A and 4B has a withstand voltage set to be lower than both the withstand voltages of the cell region A1 and the circuit element region A2 included in the element-forming region A.

Specifically, in the present embodiment, as shown in FIG. 10, each of the voltage-withstanding regions 4A and 4B includes a p-n junction portion between the p-type well region 122 and the n-type drift layer 11, a $p^+$ contact region 42 (i.e., a high-concentration semiconductor region that is of the second conductive type) provided in a surface region of the p-type well region 122, and an electrode portion 41 electrically connected with the $p^+$ contact region 42.

That is, in the present embodiment, the voltage-withstanding region 4A located on the outer peripheral side is identical to that described in the first embodiment (see FIG. 1). However, unlike in the first embodiment, the depth of the $p^+$ contact region 42 of the voltage-withstanding region 4B located on the inner peripheral side is equal to that of the $p^+$ contact region 42 of the voltage-withstanding region 4A located on the outer peripheral side in the present embodiment.

Hence, in the present embodiment, in each of the voltage-withstanding regions 4A and 4B, there is formed a surge absorption portion as enclosed with dashed lines in FIG. 10. The surge absorption portion is constituted of both the $p^+$ contact region 42 and the electrode portion 41 included in the voltage-withstanding region. Moreover, the surge absorption portion is electrically connected to the emitter electrode 13, forming a surge absorption path.

Moreover, as in the first embodiment, it is possible to lower the withstand voltage of the voltage-withstanding region 4A by adjusting the curvature of the p-type well region 122 at the edge 12b of the outer peripheral end portion 12a, thereby allowing the voltage-withstanding region 4A to be broken down earlier than the voltage-withstanding region 4B.

In addition, in the present embodiment, the curvature of the p-type well region 122 at the edge 12b of the outer peripheral end portion 12a is set to be constant over the entire boundary region B1. However, it should be noted that the curvature of the p-type well region 122 at the edge 12b of the outer peripheral end portion 12a may be set to be different between that part of the boundary region B1 which adjoins the circuit element region A2 and that part of the boundary region B1 which adjoins the cell region A1.

As described above, in the present embodiment, both the voltage-withstanding regions 4A and 4B are uniformly formed around the entire element-forming region A that includes the cell region A1 and the circuit element region A2. Consequently, the surge absorption area in the boundary region B1 of the outer peripheral voltage-withstanding region B is increased. Moreover, it becomes possible to suppress the surge current from being biased in the boundary region B1, thereby making it possible to uniformly absorb surge over the entire boundary region B1 that surrounds the element-forming region A.

Moreover, in the present embodiment, the withstand voltage of the voltage-withstanding region 4A located on the outer peripheral side is set to be lower than that of the voltage-withstanding region 4B located on the inner peripheral side, thereby allowing the voltage-withstanding region 4A to be broken down earlier than the voltage-withstanding region 4B. Consequently, it becomes possible to reduce the surge current flowing to the circuit element region A2 and prevent a latch-up phenomenon from occurring due to an unintentional parasitic structure.

In addition, as described above, in the present embodiment, both the voltage-withstanding regions 4A and 4B are uniformly formed around the entire element-forming region A. Alternatively, it is possible to form both the voltage-withstanding regions 4A and 4B only in the vicinity of part of the element-forming region A where it is easy for local concentration of electric current to occur. In other words, it is possible to have no voltage-withstanding region formed in the vicinity of part of the element-forming region A where it is unlikely for local concentration of electric current to occur.

Third Embodiment

Figure 11:
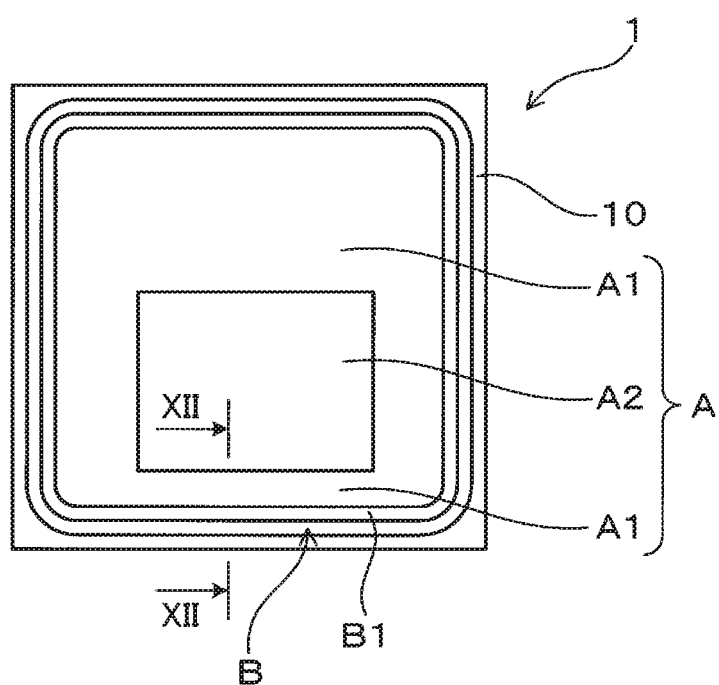
FIG. 11 is a plan view of a semiconductor device according to a third embodiment.
Figure 12:
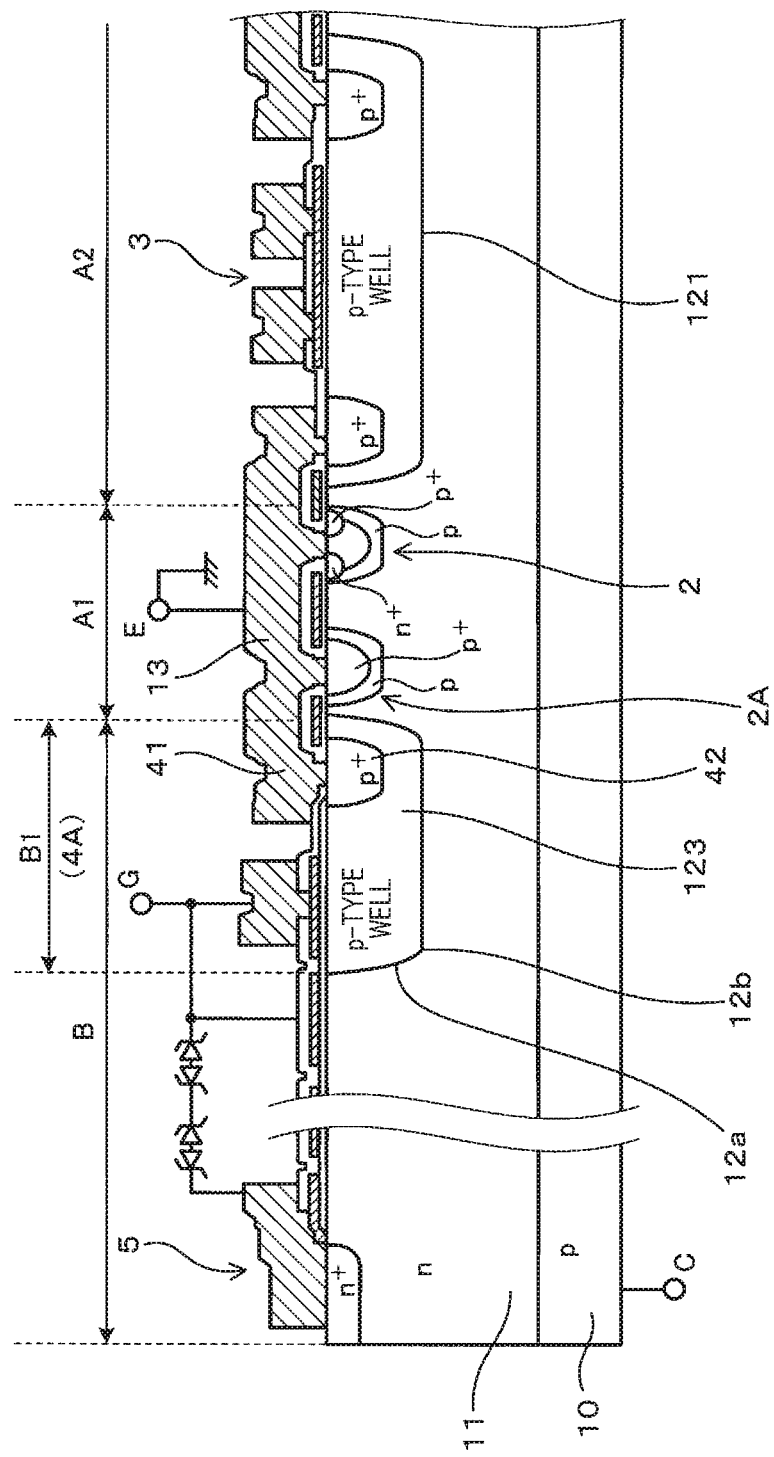
FIG. 12 is an enlarged cross-sectional view, taken along the line XII-XII in FIG. 11, of part of the semiconductor device according to the third embodiment.

FIGS. 11 and 12 show the overall configuration of a semiconductor device 1 according to the third embodiment.

As shown in FIG. 11, in the present embodiment, the element-forming region A is substantially square-shaped and surrounded by the outer peripheral voltage-withstanding region B that is substantially square loop-shaped. The circuit element region A2 is rectangular-shaped and located adjacent to but spaced from one of the four straight portions of the outer peripheral voltage-withstanding region B. More specifically, the circuit element region A2 is spaced at a predetermined interval from the adjacent straight portion of the outer peripheral voltage-withstanding region B. The remaining part of the element-forming region A, where no circuit element region A2 is formed, constitutes the cell region A1. That is, in the present embodiment, the circuit element region A2 is entirely surrounded by the cell region A1. In addition, the cell region A1 and the circuit element region A2 may have the same basic configurations as those described in the first embodiment.

Specifically, in the present embodiment, as shown in FIG. 12, the cell region A1 is interposed between the outer peripheral voltage-withstanding region B and the circuit element region A2 over the entire circumference of the outer peripheral voltage-withstanding region B. In the boundary region B1 of the outer peripheral voltage-withstanding region B which adjoins the cell region A1, there is provided only the voltage-withstanding region 4A that has a withstand voltage set to be lower than both the withstand voltages of the cell region A1 and the circuit element region A2.

As in the first embodiment, the voltage-withstanding region 4A includes a p-n junction portion between the p-type well region 123 and the n-type drift layer 11, a $p^+$ contact region 42 (i.e., a high-concentration semiconductor region that is of the second conductive type) provided in a surface region of the p-type well region 123, and an electrode portion 41 electrically connected with the $p^+$ contact region 42. Hence, in the voltage-withstanding region 4A, there is formed a surge absorption portion that is constituted of both the $p^+$ contact region 42 and the electrode portion 41. Moreover, the surge absorption portion is electrically connected to the emitter electrode 13, forming a surge absorption path.

In the present embodiment, as shown in FIG. 12, in the cell region A1, there are arranged cells in two rows. Specifically, in the first row that is immediately adjacent to the boundary region B1, there are arranged the second cells 2A that have no parasitic transistor structure. On the other hand, in the second row that is immediately adjacent to the circuit element region A2, there are arranged the IGBT cells 2 (i.e., first cells).

In addition, it should be noted that in the cell region A1, the IGBT cells 2 may alternatively be arranged in two or more rows and the second cells 2A may alternatively be arranged in two or more rows such that at least one row of the second cells 2A is arranged on the outer peripheral side of all of the IGBT cells 2. For example, the cell region A1 may alternatively have the second cells 2A arranged in two rows and the IGBT cells 2 arranged in a single row on the inner peripheral side of the two rows of the second cells 2A.

As in the first embodiment, each of the IGBT cells 2 includes a collector layer that is constituted of the p-type semiconductor substrate 10, a base layer that is constituted of the p-type semiconductor region 21 formed in a surface region of the n-type drift layer 11, an emitter layer that is constituted of the $n^+$-type semiconductor regions 22 formed in a surface region of the p-type semiconductor region 21, and a base contact layer that is constituted of the $p^+$-type semiconductor region 23 formed between each adjacent pair of the $n^+$-type semiconductor regions 22. On the other hand, the second cells 2A have no $n^+$-type semiconductor regions 22 and thus no parasitic transistor structure formed therein. Therefore, the second cells 2A are hardly affected by the surge current flowing in the boundary region B1 of the outer peripheral voltage-withstanding region B.

As described above, in the present embodiment, the cell region A1 adjoins the boundary region B1 of the outer peripheral voltage-withstanding region B over the entire circumference of the boundary region B1. Moreover, in the boundary region B1, there is provided the voltage-withstanding region 4A that has a withstand voltage set to be lower than both the withstand voltages of the cell region A1 and the circuit element region A2. Furthermore, in the cell region A1, there are arranged the second cells 2A at least in the first row immediately adjacent to the boundary region B1.

That is, in the present embodiment, the cell region A1 is formed to surround the entire circuit element region A2, and the voltage-withstanding region 4A is formed to surround the entire cell region A1. Consequently, it becomes possible to reliably suppress the surge current from being biased, thereby making it possible to uniformly and stably absorb surge on the outer peripheral side of the circuit element region A2. As a result, it becomes possible to improve the surge resistance of the semiconductor device 1.

In addition, as described previously, in the first embodiment, part of the boundary region B1 adjoins the circuit element region A2 (see FIG. 2); both the voltage-withstanding regions 4A and 4B are formed in that part of the boundary region B1 which adjoins the circuit element region A2 (see FIG. 1). In the second embodiment, part of the boundary region B1 adjoins the circuit element region A2 (see FIG. 9); both the voltage-withstanding regions 4A and 4B are uniformly formed around the entire element-forming region A that includes the cell region A1 and the circuit element region A2 (see FIG. 10). In the third (i.e., the present) embodiment, the cell region A1 is formed to surround the entire circuit element region A2 (see FIG. 11); the voltage-withstanding region 4A is formed to surround the entire cell region A1 (see FIG. 12). Consequently, in each of the first, second and third embodiments, it is possible to prevent large surge current from flowing in the vicinity of the circuit element region A2 where various circuit elements 3 are arranged, thereby improving the latch-up resistance of the semiconductor device 1.

Figure 13:
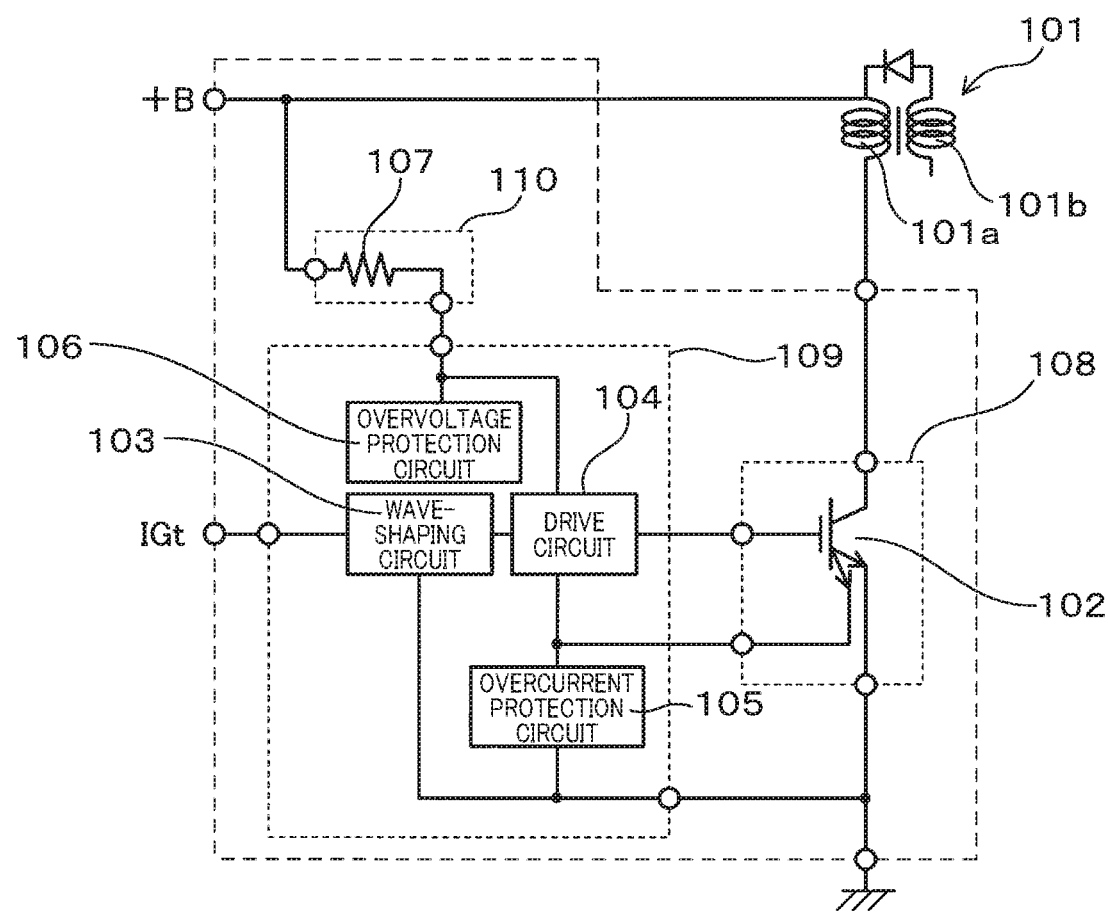
FIG. 13 is a schematic view illustrating the overall configuration of an ignition apparatus for an internal combustion engine, the ignition apparatus including an igniter section that is constituted of a semiconductor device according to a third comparative example.

FIG. 13 shows the configuration of a semiconductor device 1 according to a third comparative example. The semiconductor device 1 is applied to an ignition apparatus for an internal combustion engine to constitute the igniter section 100 of the ignition apparatus. In this comparative example, the power element 102 (corresponding to the cell region A1 of the semiconductor device 1) is provided on a different semiconductor substrate from the circuits (corresponding to the circuit element region A2 of the semiconductor device 1) for controlling and protecting the power element 102.

More specifically, in the third comparative example, the power element 102 is provided on a semiconductor substrate 108. The wave-shaping circuit 103, the drive circuit 104, the overcurrent protection circuit 105 and the overvoltage protection circuit 106 are provided on another semiconductor substrate 109. The resistor 107 for noise absorption is provided on yet another semiconductor substrate 110.

With the above configuration, the IGBT cells 2 of the semiconductor device 1 which constitute the power element 102 are provided on the semiconductor substrate 108 while the circuit elements 3 of the semiconductor device 1 which constitute the circuits for controlling and protecting the power element 102 are provided on the semiconductor substrates 109 and 110. Consequently, mutual electrical interference between the IGBT cells 2 and the circuit elements 3 can be suppressed. However, with the above configuration, it is necessary to provide electrical connection between the different semiconductor substrates 108-110 by, for example, wire bonding. Consequently, the size of the entire semiconductor device 1 may become too large.

In contrast, in each of the above-described embodiments, both the element-forming region A, which includes the cell region A1 and the circuit element region A2, and the outer peripheral voltage-withstanding region B are provided on the common semiconductor substrate 10. Consequently, it becomes unnecessary to provide electrical connection between different semiconductor substrates by, for example, wire bonding. Moreover, it also becomes unnecessary to configure the semiconductor device 1 as a multi-chip device. As a result, it becomes possible to make the entire semiconductor device 1 compact in size. Furthermore, at least one voltage-withstanding region (more particularly, the voltage-withstanding region 4A in the first and third embodiments and both the voltage-withstanding regions 4A and 4B in the second embodiment) is uniformly formed, in the boundary region B1 of the outer peripheral voltage-withstanding region B, around the entire element-forming region A that includes the cell region A1 and the circuit element region A2. Consequently, it becomes possible to form a uniform surge-absorption path in the entire boundary region B1 of the outer peripheral voltage-withstanding region B, thereby suppressing the surge current from being biased in the boundary region B1. As a result, it becomes possible to uniformly absorb surge over the entire boundary region B1.

Hence, according to the above-described embodiments, it becomes possible to realize a semiconductor device 1 that is superior in surge resistance, compact in size and high in reliability.

While the above particular embodiments have been shown and described, it will be understood by those skilled in the art that various modifications, changes, and improvements may be made without departing from the spirit of the present invention.

For example, in the above-described embodiments, in the boundary region B1 of the outer peripheral voltage-withstanding region B, there is provided only the voltage-withstanding portion 4A or both the voltage-withstanding portions 4A and 4B. However, it is also possible to provide three or more voltage-withstanding regions in the boundary region B1 of the outer peripheral voltage-withstanding region B.

In the above-described embodiments, the semiconductor device 1 is applied to an ignition apparatus for an internal combustion engine to constitute the igniter section 100 of the ignition apparatus. However, the semiconductor device 1 may alternatively be applied to other apparatuses for the internal combustion engine. Furthermore, the semiconductor device 1 may alternatively be applied to apparatuses for any other usages to constitute a power element and circuits for controlling and/or protecting the power element.

What is claimed is:

1. A semiconductor device comprising:
a semiconductor substrate having a major surface;
a first semiconductor region that is of a first conductive type and provided on the major surface of the semiconductor substrate; and
an element-forming region and an outer peripheral voltage-withstanding region both of which are provided on the major surface side of the semiconductor substrate, wherein
the element-forming region includes both a cell region and a circuit element region,
the cell region includes a second semiconductor region that is of a second conductive type and provided in a surface region of the first semiconductor region to form a power element,
the circuit element region includes a third semiconductor region that is of the second conductive type and provided in the surface region of the first semiconductor region to form at least one circuit element,
the circuit element region is interposed between the outer peripheral voltage-withstanding region and the cell region,
the outer peripheral voltage-withstanding region includes a boundary region that adjoins the element-forming region,
the boundary region includes a fourth semiconductor region that is of the second conductive type and provided in the surface region of the first semiconductor region,
in the fourth semiconductor region, there is provided one or more voltage-withstanding regions, and
at least one of the one or more voltage-withstanding regions has a withstand voltage lower than both a withstand voltage of the cell region and a withstand voltage of the circuit element region.

2. The semiconductor device as set forth in claim 1, wherein the one or more voltage-withstanding regions are provided to surround the entire element-forming region.

3. The semiconductor device as set forth in claim 1, wherein the fourth semiconductor region is formed integrally with the third semiconductor region so as to be continuous with the third semiconductor region.

4. The semiconductor device as set forth in claim 1, wherein the one or more voltage-withstanding regions include a high-concentration semiconductor region that is of the second conductive type and provided in a surface region of the fourth semiconductor region, and an electrode portion connected with the high-concentration semiconductor region.

5. The semiconductor device as set forth in claim 4, wherein in the cell region, there are provided cells that have a low-potential electrode provided on the major surface side of the semiconductor substrate and a high-potential electrode provided on an opposite side of the semiconductor substrate to the major surface side, and
the electrode portion of the one or more voltage-withstanding regions is connected with the low-potential electrode of the cells.

6. The semiconductor device as set forth in claim 5, wherein the cells comprise first cells each constituting a basic unit of the power element and second cells having no parasitic transistor structure, and
the second cells are provided immediately adjacent to the boundary region of the outer peripheral voltage-withstanding region.

7. The semiconductor device as set forth in claim 1, wherein the at least one circuit element comprise a plurality of circuit elements for forming a circuit for controlling or protecting the power element.

8. The semiconductor device as set forth in claim 1, wherein the one or more voltage-withstanding regions provided in the fourth semiconductor region comprise a plurality of voltage-withstanding regions, and
all of the plurality of voltage-withstanding regions have a lower withstand voltage than both the cell region and the circuit element region.

9. The semiconductor device as set forth in claim 1, wherein the at least one circuit element comprises a switching element.

10. The semiconductor device as set forth in claim 1, wherein the at least one circuit element forms a circuit for controlling the cell region.

11. The semiconductor device as set forth in claim 1, wherein the at least one circuit element forms a circuit for protecting the cell region.

* * * * *